(12) United States Patent
Tammone, Jr.

(10) Patent No.: US 6,316,997 B1
(45) Date of Patent: Nov. 13, 2001

(54) CMOS AMPLIFIERS WITH MULTIPLE GAIN SETTING CONTROL

(75) Inventor: John M. Tammone, Jr., Vista, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/535,265

(22) Filed: Mar. 23, 2000

(51) Int. Cl.[7] ...................................................... H03G 3/30
(52) U.S. Cl. ............................................. 330/254; 330/278
(58) Field of Search ..................................... 330/252, 253, 330/254, 310, 277, 728

(56) References Cited

U.S. PATENT DOCUMENTS

| | | | |
|---|---|---|---|
| 4,459,555 | 7/1984 | Jett, Jr. ................................. | 330/253 |
| 4,547,743 | * 10/1985 | Goto ..................................... | 330/254 |
| 5,210,504 | 5/1993 | Yagita et al. ......................... | 330/253 |
| 5,384,501 | * 1/1995 | Koyama et al. ..................... | 327/336 |
| 5,389,893 | * 2/1995 | Itri et al. .............................. | 330/254 |
| 5,650,747 | 7/1997 | Chen .................................... | 327/552 |
| 5,661,432 | 8/1997 | Chang et al. ........................ | 327/552 |
| 5,668,502 | 9/1997 | Rijns .................................... | 330/254 |

* cited by examiner

Primary Examiner—Tuan T. Lam
(74) Attorney, Agent, or Firm—Blakely, Sokoloff, Taylor & Zafman LLP

(57) ABSTRACT

CMOS differential amplifiers having a multiple gain selectable by a gain control signal that may be directly coupled for cascading. The amplifiers have a differential input pair of transistors, each with a load device in its drain circuit and a current source in its source circuit. The differential input is applied to the gates of the transistors and a differential output taken from the drains of the transistors. A third resistor is coupled between the sources of the transistors for a first, relatively low gain setting. A series resistance and capacitance network may be controllably coupled between the sources of the first and second transistors. The capacitance is chosen to have a relatively low impedance at the signal frequencies, effectively coupling the series resistance in parallel with the third resistor to set a second, higher gain. At zero frequency, the capacitance will act like an open circuit, allowing the amplifiers to be cascaded by direct connection for high and accurately controllable gain at signal frequencies without similar amplification of amplifier offsets.

20 Claims, 1 Drawing Sheet

CMOS AMPLIFIERS WITH MULTIPLE GAIN SETTING CONTROL

BACKGROUND OF THE INVENTION

1. Field of the Invention

The present invention relates to the field of CMOS differential amplifiers.

2. Prior Art

CMOS differential amplifiers having a multiple gain selectable by a gain control signal are well known in the art. Such amplifiers include amplifiers having a differential input pair of transistors, each with a load resistor in its drain circuit and a current source in its source circuit. The differential input is applied to the gates of the transistors and a differential output taken from the drains of the transistors. A third resistor is coupled between the sources of the transistors, with a third switching transistor coupled across the third resistor to controllably short out the resistor. With the third transistor off, the gain of the amplifier is proportional to the ratio of the resistances of the load resistors to the third resistor. With the third transistor on, effectively connecting the sources of the first and second transistors, the differential amplifier will have a high gain, dependent on the product of the transconductance of the first and second transistors.

Amplifiers of the foregoing type work well when used alone, but cannot be easily cascaded. In particular, such amplifiers amplify not only the signal, but the DC offsets also, so that if one tries to cascade multiple amplifiers for substantial gain by direct connection, the DC offsets would be amplified also, likely saturating the latter stages. AC coupling could be used between stages, but that would not only require coupling capacitors between stages, but also biasing circuits between stages to bias the gates of the next stage.

BRIEF SUMMARY OF THE INVENTION

CMOS differential amplifiers having a multiple gain selectable by a gain control signal that may be directly coupled for cascading are disclosed. The amplifiers have a differential input pair of transistors, each with a load device in its drain circuit and a current source in its source circuit. The differential input is applied to the gates of the transistors and a differential output taken from the drains of the transistors. A third resistor is coupled between the sources of the transistors for one, relatively low gain setting. A series resistance and capacitance network may be controllably coupled between the sources of the first and second transistors. The capacitance is chosen to have a relatively low impedance at the signal frequencies, effectively coupling the series resistance in parallel with the third resistor to set a second, higher gain. At zero frequency, the capacitance will act like an open circuit, allowing the amplifiers to be cascaded by direct connection for high gain at signal frequencies without similar amplification of amplifier offsets.

DETAILED DESCRIPTION OF THE PREFERRED EMBODIMENT

Figure 1:
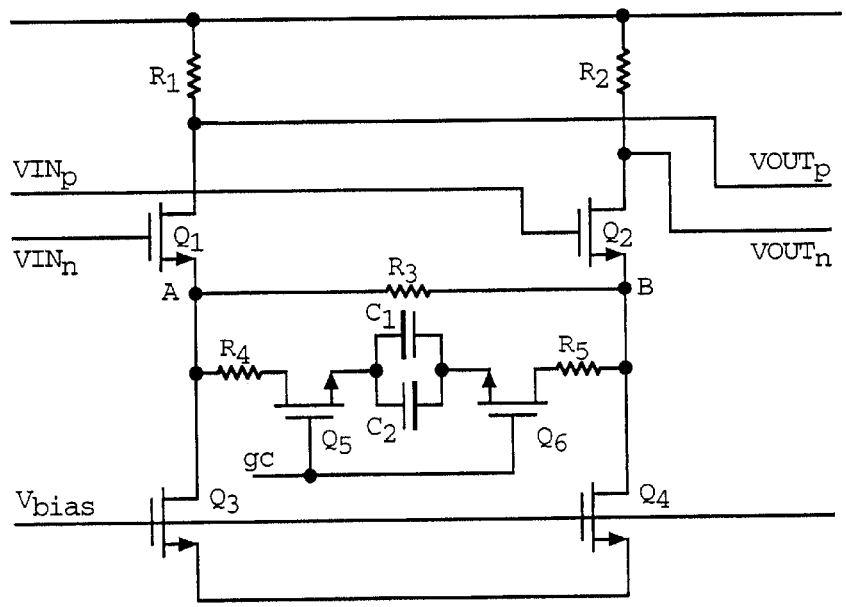
FIG. 1 is a circuit diagram illustrating an individual CMOS amplifier in accordance with a preferred embodiment of the invention.

First referring to FIG. 1, a representative circuit diagram of an individual CMOS amplifier with a selectable gain setting may be seen. In this embodiment, transistors $Q_1$ and $Q_2$ are matched transistors, transistors $Q_3$ and $Q_4$ are matched transistors, transistors $Q_5$ and $Q_6$ are matched transistors, resistors $R_1$ and $R_2$ are of the same resistance, resistors $R_4$ and $R_5$ are of the same resistance, and capacitors $C_1$ and $C_2$ are of the same capacitance. As shown therein, N-channel transistors $Q_3$ and $Q_4$ are biased by bias voltage $V_{bias}$ to act as equal current sources, one on each branch of the differential amplifier. The differential input signal $VIN_p$, $VIN_n$ is provided to the gates of N-channel transistors $Q_1$ and $Q_2$, respectively. The drains of transistors $Q_1$ and $Q_2$ are coupled to a positive power supply through load resistors $R_1$ and $R_2$, respectively, with the outputs $VOUT_p$, $VOUT_n$ of the CMOS amplifier being taken as the voltages on resistors $R_1$ and $R_2$. The sources of transistors $Q_1$ and $Q_2$ are coupled together through resistor $R_3$, and are coupled to the current sources provided by transistors $Q_3$ and $Q_4$, respectively. The sources of transistors $Q_1$ and $Q_2$ are also coupled to a circuit comprising resistors $R_4$ and $R_5$, N-channel transistors $Q_5$ and $Q_6$ and capacitors $C_1$ and $C_2$.

Capacitors $C_1$ and $C_2$, like the rest of the circuit shown in FIG. 1, are fabricated in integrated circuit form, with a conductive layer separated from a diffused region on the semiconductor substrate by an insulative region, typically an oxide. The two capacitors are used with opposite connections for symmetry in the combined structure. Transistors $Q_5$ and $Q_6$, controlled by gain control signal gc applied to the gates thereof, act as switching transistors in response to the two-state gain control signal gc, to either connect the parallel combination of capacitors $C_1$ and $C_2$ in series with resistors $R_4$ and $R_5$, or to leave the circuit between the sources of transistors $Q_1$ and $Q_2$ open.

With transistors $Q_5$ and $Q_6$ turned off, the sources of transistors $Q_1$ and $Q_2$ are connected by the resistor $R_3$ only. With a zero differential input $VIN_p$, $VN_n$, transistors $Q_1$ and $Q_2$ will each conduct the same amount of current, namely, the current of current 10 sources formed by transistors $Q_3$ and $Q_4$, respectively. Since transistors $Q_1$ and $Q_2$ are of equal size, the gate source voltage of the two transistors will be equal, so that the voltage across, and thus the current through, resistor $R_3$ will be zero.

While the gate source voltage of MOS transistors will vary slightly with the variation in current therethrough, it is assumed for purposes of the following discussion that this variation is small, and accordingly, is ignored. With this assumption, with a positive differential input $VIN_p$, $VIN_n$, the voltage at node B will be equal to one gate source voltage below the voltage of the input $VIN_p$ and the voltage of node A will be one gate source voltage below the input voltage $VIN_n$, giving a voltage $V_B-V_A$ across resistor $R_3$ equal to $VIN_p-VIN_n$. Consequently, there will be a current through resistor $R_3$ equal to $(VIN_p-VIN_n)/R_3$. Since the current through transistor $Q_3$ is fixed, the current through resistor $R_3$ from node B to node A will reduce the current through resistor $R_1$ by the same amount, so that the voltage across resistor $R_1$ will decrease by $(VIN_p-VIN_n)R_1/R_3$. Similarly, the current through transistor $Q_2$ will increase by an amount equal to the current through resistor $R_3$ so that the voltage drop across resistor $R_2$ will increase by an amount equal to $(VIN_p-VIN_n)R_2/R_3$. With $R_1=R_2=R$, the differential output voltage $VOUT_p-VOUT_n$ will equal $2(VIN_p-VIN_n)R/R_3$, for a gain $A_V$ of $2R/R_3$.

The same type of analysis applies when the gain control signal gc is high, turning on transistors $Q_5$ and $Q_6$ Since the present invention CMOS amplifiers are intended for use in at least moderate frequency applications, the exemplary embodiment being intended for use in cell phone applications, the parallel combination of capacitors $C_1$ and $C_2$ provide a relatively low impedance at the frequencies of interest, so that the impedance of the combination of resistors $R_4$ and $R_5$, capacitors $C_1$ and $C_2$ and transistors $Q_5$ and $Q_6$ can be approximated as $R_4+R_5$. Assuming $R_4=R_5=R_6$, the impedance of these resistors in the parallel combination with resistor $R_3$ is $2R_3R_b/(R_3+2R_b)$. Thus, now the gain $A_V$ of the amplifier will be:

$$A_V=R(R_3+2R_b)/R_3R_b$$

Figure 2:
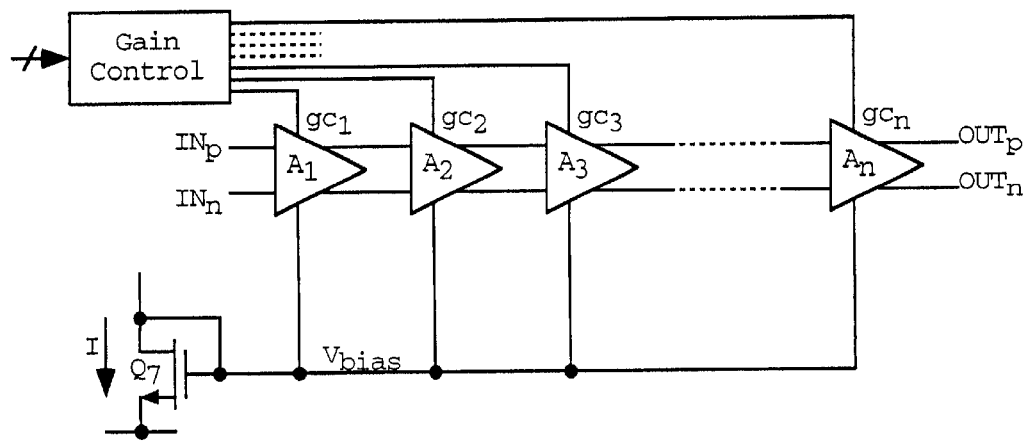
FIG. 2 is a block diagram illustrating the direct connection and control of cascaded individual amplifiers of FIG. 1.

Thus, the individual amplifier of FIG. 1 has a gain at the frequencies of interest selectable between two values by control of the gain control signal gc. Under DC conditions, however, even with transistors $Q_5$ and $Q_6$ turned on, capacitors $C_1$ and $C_2$ will act as an open circuit so that the DC gain will remain at $2R/R_3$, independent of the state of the gain control signal gc. Also, by appropriate selection of the threshold of transistors $Q_1$ and $Q_2$, the circuit may operate with a common mode input voltage equal to the common mode output voltage of the amplifier. This allows multiple amplifiers to be directly cascaded without DC isolation between the amplifiers, as illustrated in FIG. 2. As shown in that Figure, the output of amplifier of $A_1$ may be directly connected to the input of amplifier $A_2$, the output of amplifier $A_2$ may be directly connected to the input of amplifier $A_3$, etc., allowing the direct cascading of individual amplifiers. In a typical application, each amplifier would have its own gain control signal $gc_n$, controlled typically by a digital gain control. Similarly, the bias voltage $V_{bias}$ of each individual amplifier (FIG. 1) would be provided by a current mirroring circuit, illustrated schematically as transistor $Q_7$ of FIG. 2.

The direct cascading of amplifiers as shown in FIG. 2 will result in the amplification of any DC offsets, either existing in the differential input signal $IN_p, IN_n$, or injected by any of the individual amplifiers $A_n$. However, by selecting the DC gain $2R/R_3$ to be on the order of 1 or less, little or no amplification of the DC offsets will occur, allowing the amplifiers to be cascaded as shown in substantial numbers to allow a wide range and wide selection of gains through the gain control without risk of saturation or significant limiting of the signal swing. By way of example only, one might cascade twelve amplifiers in the manner shown, each with a DC gain of 1 (0 db). This will also be the gain at the frequencies of interest with transistors $Q_5$ and $Q_6$ turned off, with a higher gain at the frequencies of interest when transistors $Q_5$ and $Q_6$ are turned on. Taking the example further, eight of these individual amplifiers may be given a gain of 10 db, one 5 db, one 2.5 db, one 1.25 db and one 0.63 db. Such a combination will allow the selection of the amplification up to almost 90 db, with a resolution of slightly over 0.3 db.

A further advantage of the present invention, in applications where needed, is the ability of the individual amplifiers and the cascaded combination of amplifiers to operate at relatively low power supply voltages. In particular, current source transistors $Q_3$ and $Q_4$ of FIG. 1 require little headroom for proper operation, as do the differential input transistors $Q_1$ and $Q_2$. This allows the voltage swing across resistors $R_1$ and $R_2$ to be a substantial part of the rail-to-rail voltage, even when operating from a 3 volt power supply. In other applications, the active current sources formed by transistors $Q_3$ and $Q_4$ all could instead be resistive current sources, though different gains would result and higher power supply voltages would normally be required for the same signal amplitudes. Thus, while certain preferred embodiments of the present invention have been disclosed and described herein, it will be understood by those skilled in the art that various changes in form and detail may be made therein without departing from the spirit and scope of the invention.

What is claimed is:

1. A variable gain amplifier comprising:

first and second transistors, each having first and second terminals and a control terminal, the voltage between the control terminal and the second terminal of each transistor controlling the current flow through the transistor from the first terminal to the second terminal;

a controllable switch circuit;

first, second and third resistors;

a capacitance; and, first and second current sources;

the first and second resistors being coupled between the first terminals of the first and second transistors, respectively, and a first power supply terminal;

the second terminals of the first and second transistors being coupled to a second power supply terminal through the first and second current sources, respectively, and to each other through the third resistor;

the capacitance being controllably coupleable between the second terminal of the first transistor and the second terminal of the second transistor by the controllable switch circuit.

2. The variable gain amplifier of claim 1 further comprised of a resistance in series with the capacitance, the series combination of the resistance and the capacitance being controllably coupleable between the second terminal of the first transistor and the second terminal of the second transistor by the controllable switch circuit.

3. The variable gain amplifier of claim 2 wherein the resistance comprises fourth and fifth resistors, and when the controllable switch circuit is turned on, the fourth resistor is coupled between the second terminal of the first transistor and the capacitance and the fifth resistor is coupled between the second terminal of the second transistor and the capacitance.

4. The variable gain amplifier of claim 3 wherein the controllable switch circuit comprises first and second MOS transistors controllable in unison to couple to and decouple from the second terminals of both the first and second transistors, the series combination of the capacitance and the fourth and fifth resistors.

5. The variable gain amplifier of claim 4 wherein the capacitance comprises two identical integrated capacitors, each having first and second conductive plates, the capacitors being coupled in parallel with the first conductive plate of each capacitor being coupled to the second conductive plate of the other capacitor.

6. The variable gain amplifier of claim 2 wherein the first and second transistors are MOS devices, the first terminal of each transistor being the drain, the second terminal of each transistor being the source and the control terminal of each transistor being the gate.

7. The variable gain amplifier of claim 2 wherein the first and second current sources are active current sources.

8. The variable gain amplifier of claim 7 wherein the first and second current sources comprise third and fourth transistors, each having first and second terminals and a control terminal, the voltage between the control terminal and the second terminal of each transistor controlling the current flow through the transistor from the first terminal to the second terminal, the first terminals of the third and fourth transistors being coupled to the second terminals of the first and second transistors, respectively, the second terminals of the third and fourth transistors being coupled to the second power supply terminal, the control terminals of the third and fourth transistors being coupled together and to another transistor of the same type as the third and fourth transistors to mirror first and second substantially equal currents thereto, respectively.

9. The variable gain amplifier of claim 8 wherein the third and fourth transistors are MOS devices, the first terminal of each transistor being the drain, the second terminal of each transistor being the source and the control terminal of each transistor being the gate.

10. The variable gain amplifier of claim 9 further comprised of a gain control coupled to the controllable switch circuit to controllably turn the switch circuit on and off.

11. A variable gain amplifier comprising:
   a plurality of individual amplifiers, each including:
      first and second transistors, each having first and second terminals and a control terminal, the voltage between the control terminal and the second terminal of each transistor controlling the current flow through the transistor from the first terminal to the second terminal:
      a controllable switch circuit;
      first, second and third resistors;
      a capacitance; and,
      first and second current sources;
      the first and second resistors being coupled between the first terminals of the first and second transistors, respectively, and a first power supply terminal;
      the second terminals of the first and second transistors being coupled to a second power supply terminal through the first and second current sources, respectively, and to each other through the third resistor;
      the capacitance being controllably coupleable between the second terminal of the first transistor and the second terminal of the second transistor by the controllable switch circuit;
   the individual amplifiers being coupled in series by the coupling of the first terminals of the first and second transistors to the control terminals of the first and second transistors of the next individual amplifier in the series connection without DC isolation therebetween; and,
   a gain control coupled to the controllable switch circuit of each individual amplifier to controllably turn individual switch circuits on and off.

12. The variable gain amplifier of claim 11 further comprised of a resistance in series with the capacitance, the series combination of the resistance and the capacitance being controllably coupleable between the second terminal of the first transistor and the second terminal of the second transistor by the controllable switch circuit.

13. The variable gain amplifier of claim 12 wherein the resistance comprises fourth and fifth resistors, and when the controllable switch circuit is turned on, the fourth resistor is coupled between the second terminal of the first transistor and the capacitance and the fifth resistor is coupled between the second terminal of the second transistor and the capacitance.

14. The variable gain amplifier of claim 13 wherein the controllable switch circuit comprises first and second MOS transistors controllable in unison to couple to and decouple from the second terminals of both the first and second transistors, the series combination capacitance and the fourth and fifth resistors.

15. The variable gain amplifier of claim 12 wherein the first and second transistors of each individual amplifier are MOS devices, the first terminal of each transistor being the drain, the second terminal of each transistor being the source and the control terminal of each transistor being the gate.

16. The variable gain amplifier of claim 12 wherein the first and second current sources of each individual amplifier are active current sources.

17. The variable gain amplifier of claim 16 wherein the first and second current sources of each individual amplifier comprise third and fourth transistors, each having first and second terminals and a control terminal, the voltage between the control terminal and the second terminal of each transistor controlling the current flow through the transistor from the first terminal to the second terminal, the first terminals of the third and fourth transistors being coupled to the second terminals of the first and second transistors, respectively, the second terminals of the third and fourth transistors being coupled to the second power supply terminal, the control terminals of the third and fourth transistors being coupled together and to another transistor of the same type as the third and fourth transistors to mirror first and second substantially equal currents thereto, respectively.

18. The variable gain amplifier of claim 17 wherein the third and fourth transistors of each individual amplifier are MOS devices, the first terminal of each transistor being the drain, the second terminal of each transistor being the source and the control terminal of each transistor being the gate.

19. A variable gain amplifier comprising:
   first through sixth MOS transistors, each having a source, a drain and a gate;
   first through fifth resistors; and,
   a capacitance;
   the first and second resistors being coupled between the drains of the first and second transistors, respectively, and a first power supply terminal;
   the sources of the first and second transistors being coupled to the drains of the third and fourth transistors, respectively, and to each other through the third transistor;
   the sources of the third and fourth transistors being coupled to a second power supply terminal;
   the gates of the third and fourth transistors being coupled together for biasing the third and fourth transistors as current sources;
   the fourth resistor, the fifth transistor, the capacitance, the sixth transistor and the fifth resistor being coupled in series, the gates of the fifth and sixth transistors being coupled together to turn the fifth and sixth transistors on and off in unison, the capacitance being coupled through the fourth and fifth resistors to the sources of the first and second transistors, respectively, when the fifth and sixth transistors are turned on, the capacitance being decoupled from the sources of the first and second transistors, respectively, when the fifth and sixth transistors are turned off.

20. A variable gain amplifier comprising:
   a plurality of individual amplifiers, each including:
   first through sixth MOS transistors, each having a source, a drain and a gate;
   first through fifth resistors; and,
   a capacitance;
   the first and second resistors being coupled between the drains of the first and second transistors, respectively, and a first power supply terminal;

the sources of the first and second transistors being coupled to the drains of the third and fourth transistors, respectively, and to each other through the third transistor;

the sources of the third and fourth transistors being coupled to a second power supply terminal;

the gates of the third and fourth transistors being coupled together for biasing the third and fourth transistors as current sources;

the fourth resistor, the fifth transistor, the capacitance, the sixth transistor and the fifth resistor being coupled in series, the gates of the fifth and sixth transistors being coupled together to turn the fifth and sixth transistors on and off in unison, the capacitance being coupled through the fourth and fifth resistors to the sources of the first and second transistors, respectively, when the fifth and sixth transistors are turned on, the capacitance being decoupled from the sources of the first and second transistors, respectively, when the fifth and sixth transistors are turned off;

the individual amplifiers being coupled in series by the coupling of the drains of the first and second transistors to the gates of the first and second transistors of the next individual amplifier in the series connection without DC isolation there between; and, a gain control coupled to the gates of the fifth and sixth transistors of each individual amplifier to controllably turn the fifth and sixth transistors of each individual amplifier on and off in unison.

* * * * *